(12) United States Patent
Chen et al.

(10) Patent No.: US 11,139,645 B2
(45) Date of Patent: Oct. 5, 2021

(54) CABLE MANAGEMENT ASSEMBLY

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Kai-Wen Yu, Kaohsiung (TW); Chun-Chiang Wang, Kaohsiung (TW)

(73) Assignees: KING SLIDE WORKS CO., LTD., Kaohsiung (TW); KING SLIDE TECHNOLOGY CO., LTD., Kaohsiung (TW)

( * ) Notice: Subject to any disclaimer, the term of this patent is extended or adjusted under 35 U.S.C. 154(b) by 0 days.

(21) Appl. No.: 16/810,777

(22) Filed: Mar. 5, 2020

(65) Prior Publication Data

US 2021/0184446 A1    Jun. 17, 2021

(30) Foreign Application Priority Data

Dec. 12, 2019  (TW) .................................. 108145907

(51) Int. Cl.
| | |
|---|---|
| *F16L 3/00* | (2006.01) |
| *H02G 3/32* | (2006.01) |
| *F16L 3/01* | (2006.01) |
| *H02G 3/04* | (2006.01) |
| *H05K 7/14* | (2006.01) |

(52) U.S. Cl.
CPC .................. *H02G 3/32* (2013.01); *F16L 3/01* (2013.01); *H02G 3/0437* (2013.01); *H02G 3/0456* (2013.01); *H05K 7/1491* (2013.01)

(58) Field of Classification Search
CPC ...... H05K 7/14; H05K 7/1491; H05K 7/1421; H02G 3/32; H02G 3/047; F16L 3/08
USPC .................................... 248/67.7, 65, 68.1, 73
See application file for complete search history.

(56) References Cited

U.S. PATENT DOCUMENTS

| | | |
|---|---|---|
| 8,186,634 B2 | 5/2012 | Chen |
| 9,072,190 B2 | 6/2015 | Chen |
| 9,072,194 B2* | 6/2015 | Chen ..................... H05K 7/1491 |
| 9,144,174 B2 | 9/2015 | Chen |
| 9,402,329 B1* | 7/2016 | Chen ......................... F16L 3/08 |
| 10,389,100 B2 | 8/2019 | Chen |
| 2009/0014601 A1* | 1/2009 | Chen ..................... H05K 7/1491 |
| | | 248/70 |

(Continued)

FOREIGN PATENT DOCUMENTS

| | | |
|---|---|---|
| EP | 3 041 329 A1 | 7/2016 |
| EP | 3 445 140 A1 | 2/2019 |
| TW | 201418607 A | 5/2014 |

*Primary Examiner* — Steven M Marsh
(74) *Attorney, Agent, or Firm* — Winston Hsu

(57) ABSTRACT

A cable management assembly includes a cable management device and a supporting device. The cable management device includes a first arm, a second arm and an intermediate frame being mounted between the first arm and the second arm. The intermediate frame includes a first mounting feature. The supporting device is configured to support one of the first arm, the second arm and the intermediate frame. The supporting device includes a base and an elastic member being arranged at the base. The elastic member has a second mounting feature configured to be detachably mounted to the first mounting feature.

20 Claims, 12 Drawing Sheets

(56) References Cited

U.S. PATENT DOCUMENTS

2014/0158646 A1* 6/2014 Chen .................... H05K 7/1491
                                                    211/26
2020/0060040 A1* 2/2020 Chen ...................... H02G 11/00

* cited by examiner

CABLE MANAGEMENT ASSEMBLY

BACKGROUND OF THE INVENTION

1. Field of the Invention

The present invention relates to a cable management mechanism, and more particularly, to a cable management assembly capable of managing cables.

2. Description of the Prior Art

In general, a cable management assembly includes two cable management arms. The two cable management arms are able to be respectively mounted on a fixed rail and a movable rail through a first connecting device and a second connecting device respectively. The movable rail is configured to carry a carried object (such as an electrical apparatus). When the movable rail is moved relative to the fixed rail along an extending direction, the two cable management arms are able to be unfolded relative to each other. When the movable rail is moved relative to the fixed rail along a retracting direction, the two cable management arms are able to be folded relative to each other. Wherein, the cable management arm is configured to manage cables behind the carried object. In a preferable embodiment, the cable management assembly further includes a supporting device configured to support the two cable management arms at bottom.

U.S. Pat. No. 8,186,634 B2 discloses a supporting device to support a cable management arm. The supporting device includes two cable management arms able to be folded and unfolded and a supporting frame able to be extended and retracted, and the supporting frame is configured to support the cable management arm. Wherein, the cable management arm is not connected to the supporting frame. The cable management arm and the supporting frame are two separate components.

U.S. Pat. No. 9,072,190 B2 discloses a cable management arm. The cable management arm includes two arms are pivoted to each other through a frame. Wherein, the two arms are respectively connected to a fixed rail and a movable rail of the first slide rail assembly through a first connecting member and a second connecting member respectively. On the other hand, a supporting device (such as two supporting member extendable and retractable relative to each other) is able to support the two arms at bottom through the frame. Furthermore, the supporting device is pivoted to the bottom of the two arms through a sliding block. The supporting device and the cable management arm are not detachable.

Therefore, for different market requirements, how to develop a cable management product, which has different structure, has become an issue.

SUMMARY OF THE INVENTION

An object of the present invention is to provide a cable management assembly and a supporting device detachably connected to the cable management assembly.

Another object of the present invention is to provide a cable management assembly including cable management arms pivoted to each other. The cable management assembly further includes a safety device, such that a user's hand is prevented from being pinched by the cable management arms due to the two arms being folded by the careless operation of the user.

According to an aspect of the present invention, a cable management assembly includes a cable management device, an intermediate frame and a supporting device. The cable management device includes a first arm, a second arm and an intermediate frame pivoted between the first arm and the second arm. The intermediate frame includes an upper frame and a lower frame. The upper frame and the lower frame respectively have a first mounting feature. The supporting device is configured to support at least one of the first arm, the second arm and the intermediate frame. The supporting device includes a base and an elastic member. Wherein, the elastic member is arranged on the base. The elastic member has a second mounting feature, and the second mounting feature is configured to be detachably mounted on the first mounting feature.

Preferably, the second mounting feature of the elastic member includes a guiding portion, when one of the supporting device and the cable management device is moved along a mounting direction relative to the other one of the supporting device and the cable management device, the second mounting feature of the supporting device and the first mounting feature of the cable management device can be guided to be mounted through the guiding portion.

Preferably, one of the cable management device and the supporting device includes a blocking feature, the base has a front end and a rear end opposite to the front end, the second mounting feature is located between the blocking feature and the front end of the base, the blocking feature is located between the second mounting feature and the rear end of the base, when one of the supporting device and the cable management device is mounted to the other one of the supporting device and the cable management device by orienting the rear end of the base as a mounting interface along the mounting direction, the supporting device and the cable management device are blocked by each other through the blocking feature, in order to prevent the second mounting feature of the supporting device and the first mounting feature of the cable management device from being mounted.

Preferably, the upper frame and the lower frame further respectively includes a first connecting feature, and the base includes a second connecting feature configured to be detachably mounted on the first connecting feature, the second connecting feature is connected to the first connecting feature in order to prevent the cable management device from being detached from the supporting device along a height direction.

Preferably, the height direction and the mounting direction are substantially perpendicular.

Preferably, one of the first connecting feature and the second connecting feature is a notch, and the other one of the first connecting feature and the second connecting feature includes a head portion and a body portion, when the notch is engaged with the body portion, an edge wall around the notch and the height direction are blocked by each other.

Preferably, the supporting device further includes at least one supporting rail, and the base is pivoted to the at least one supporting rail, the first arm and the second arm respectively have a first end portion. The first end portion of the first arm and the first end portion of the second arm are pivoted to the intermediate frame by a first pivoting member and a second pivoting member respectively.

Preferably, the cable management device further includes a first auxiliary elastic member and a second auxiliary elastic member, the first auxiliary elastic member is configured to provide an elastic force to the first arm, and the second auxiliary elastic member is configured to provide an elastic force to the second arm.

Preferably, the first auxiliary elastic member is mounted on the first pivoting member, the second auxiliary elastic member is mounted on the second pivoting member.

Preferably, the first arm and the second arm respectively have a second end portion far from the first end portion, and the second end portion of the first arm and the second end portion of the second arm are respectively pivoted to a first connecting device and a second connecting device, the at least one supporting rail is pivoted to a third connecting device.

Preferably, a first blocking member is arranged between the second end portion of the first arm and the first connecting device, the first blocking member is configured to restrict the first connecting device to be rotated relative to the second end portion of the first arm in a predetermined angle range.

Preferably, a second blocking member is arranged between the second end portion of the second arm and the second connecting device, the second blocking member is configured to restrict the second connecting device to be rotated relative to the second end portion of the second arm in the predetermined angle range.

According to another aspect of the present invention, a cable management assembly includes a cable management device and an intermediate frame. The cable management device includes a first arm, a second arm and an intermediate frame pivoted between the first arm and the second arm. Wherein, the first arm and the second arm respectively have a first end portion, and the first end portion of the first arm and the first end portion of the second arm are pivoted to the intermediate frame by a first pivoting member and a second pivoting member respectively. Wherein, the cable management device further includes a first auxiliary elastic member and a second auxiliary elastic member. The first auxiliary elastic member is mounted between the first arm and the intermediate frame. The second auxiliary elastic member is mounted between the second arm and the intermediate frame. The direction of the elastic force provided by the first auxiliary elastic member and the second auxiliary elastic member promote the first arm and the second arm to be open, not close.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
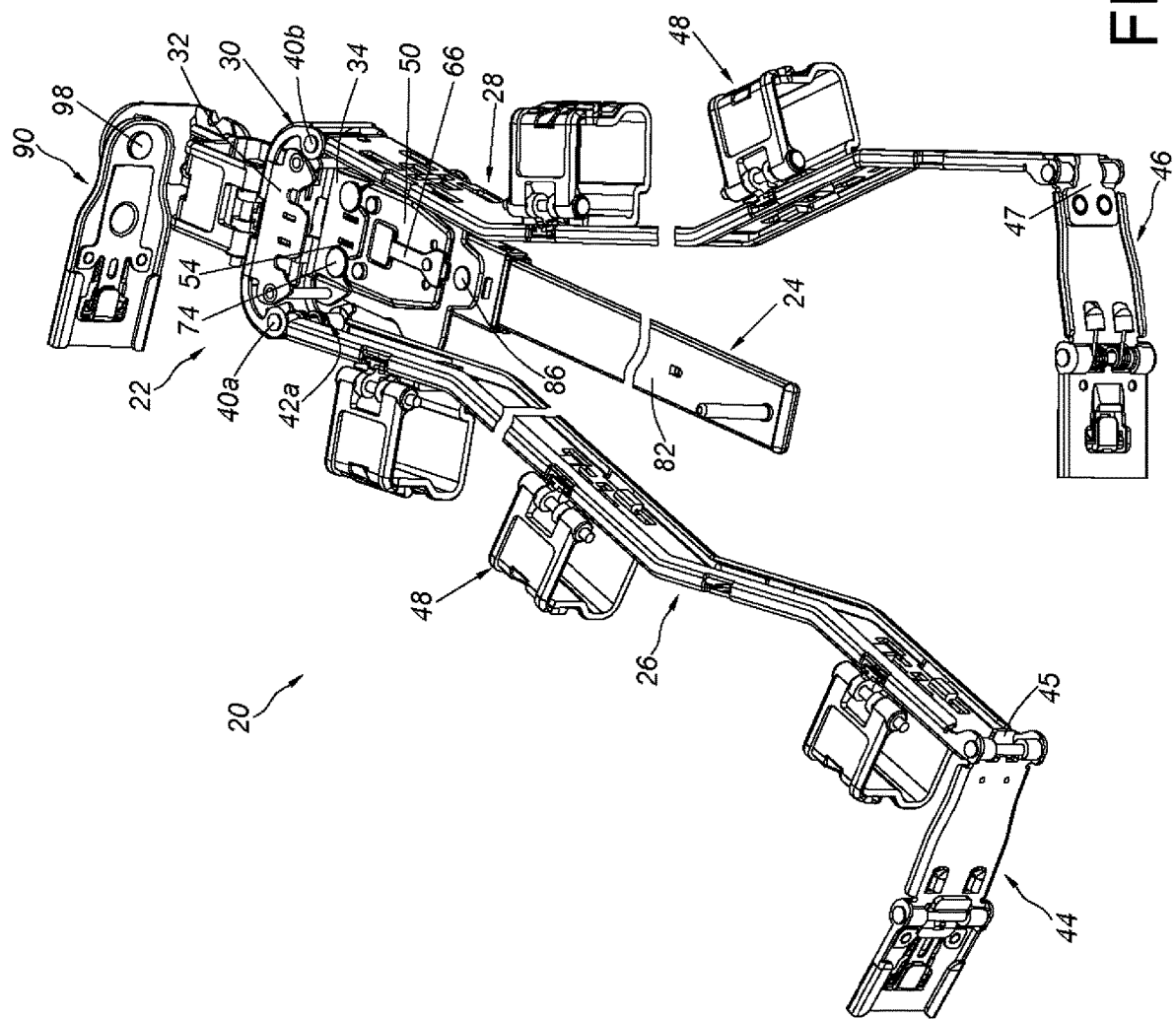
FIG. 1 is a diagram illustrating a cable management assembly according to an embodiment of the present invention.
Figure 2:
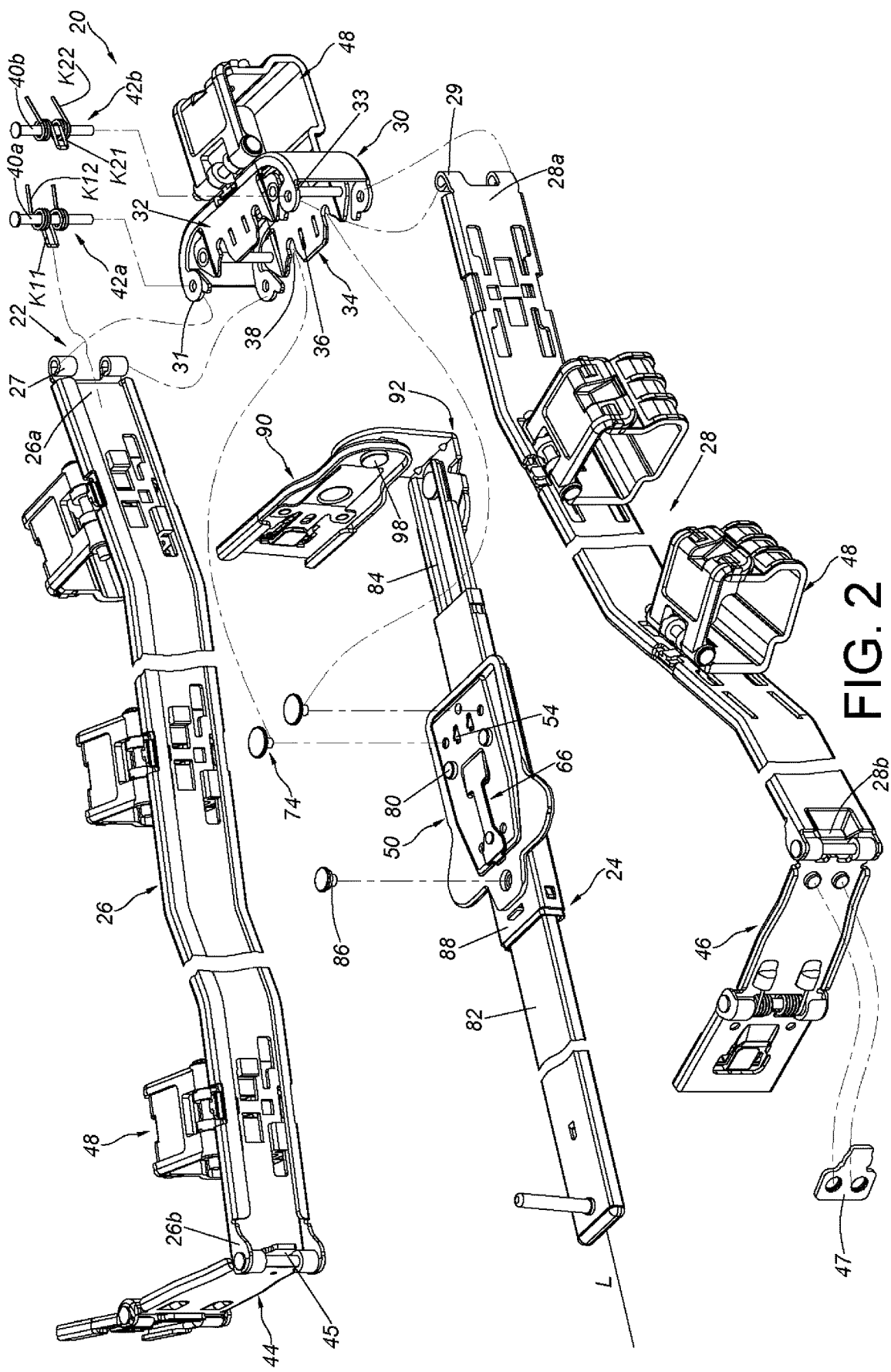
FIG. 2 is an explosion view illustrating the cable management assembly according to the embodiment of the present invention.

As shown in FIG. 1 and FIG. 2, a cable management assembly 20 of an embodiment of the present invention includes a cable management device 22 and a supporting device 24.

The cable management device 22 includes a first arm 26, a second arm 28 and an intermediate frame 30 pivoted between the first arm 26 and the second arm 28. The intermediate frame 30 includes an upper frame 32 and a lower frame 34. The upper frame 32 and the lower frame 34 have a substantially same structure arrangement. Take the lower frame 34 for example, the lower frame 34 has a first mounting feature and a first connecting feature 38. Wherein, in the present embodiment, the first mounting feature 36 is a hole, but the present invention is not limited specifically.

Preferably, the first arm 26 has a first end portion 26a and a second end portion 26b far from the first end portion 26a, and the second arm 28 also has a first end portion 28a and a second end portion 28b far from the first end portion 28a. The intermediate frame 30 has a first ear portion 31 and a second ear portion 33. Wherein, the first end portion 26a of the first arm 26 and the first end portion 28a of the second arm 28 are respectively pivoted to the first ear portion 31 and the second ear portion 33 of the intermediate frame 30 through a first pivoting member 40a and a second pivoting member 40b respectively. For example, the first pivoting member 40a penetrates through a pivoting portion 27 of the first end portion 26a of the first arm 26 and a pivoting hole on the first ear portion 31 of the intermediate frame 30, and the second pivoting member 40*b* penetrates through a pivoting portion 29 of the first end portion 28*a* of the second arm 28 and a pivoting hole on the second ear portion 33 of the intermediate frame 30. In the present embodiment, the lower frame 34 has two first connecting features 38 and two first mounting features 36. The two first connecting features 38 are arranged between the first ear portion 31 and the second ear portion 33 of the intermediate frame 30, and the two first mounting features 36 are arranged between the two first connecting features 38.

Preferably, a protection device is arranged on the cable management device 22. The protection device includes a first auxiliary elastic member 42*a* and a second auxiliary elastic member 42*b*. The first auxiliary elastic member 42*a* is configured to provide an elastic force to the first arm 26, and the second auxiliary elastic member 42*b* is configured to provide an elastic force to the second arm 28.

Preferably, the first auxiliary elastic member 42*a* is mounted on the first pivoting member 40*a*, and the second auxiliary elastic member 42*b* is mounted on the second pivoting member 40*b*. The first auxiliary elastic member 42*a* has a first elastic portion K11 and a second elastic portion K12, and the second auxiliary elastic member 42*b* also has a first elastic portion K21 and a second elastic portion K22. Wherein, the first elastic portion K11 and the second elastic portion K12 of the first auxiliary elastic member 42*a* are able to respectively support the first arm 26 and the intermediate frame 30, and the first elastic portion K21 and the second elastic portion K22 of the second auxiliary elastic member 42*b* are able to respectively support the second arm 28 and the intermediate frame 30.

Preferably, the second end portion 26*b* of the first arm 26 is pivoted to a first connecting device 44, and the second end portion 28*b* of the second arm 28 is pivoted to a second connecting device 46.

Preferably, a first blocking member 45 is arranged between the second end portion 26*b* of the first arm 26 and the first connecting device 44. Similarly, a second blocking member 47 is arranged between the second end portion 28*b* of the second arm 28 and the second connecting device 46. The second blocking member 47 and the first blocking member 45 have a substantially same structure arrangement.

Preferably, at least one cable management feature 48 is arranged on one of the first arm 26, the second arm 28 and the intermediate frame 30. The at least one cable management feature 48 is configured to manage cables of an electronic apparatus (not shown in figure). In the present embodiment, the cable management features 48 are arranged on the first arm 26, the second arm 28 and the intermediate frame 30, but the present invention is not limited specifically.

Figure 3:
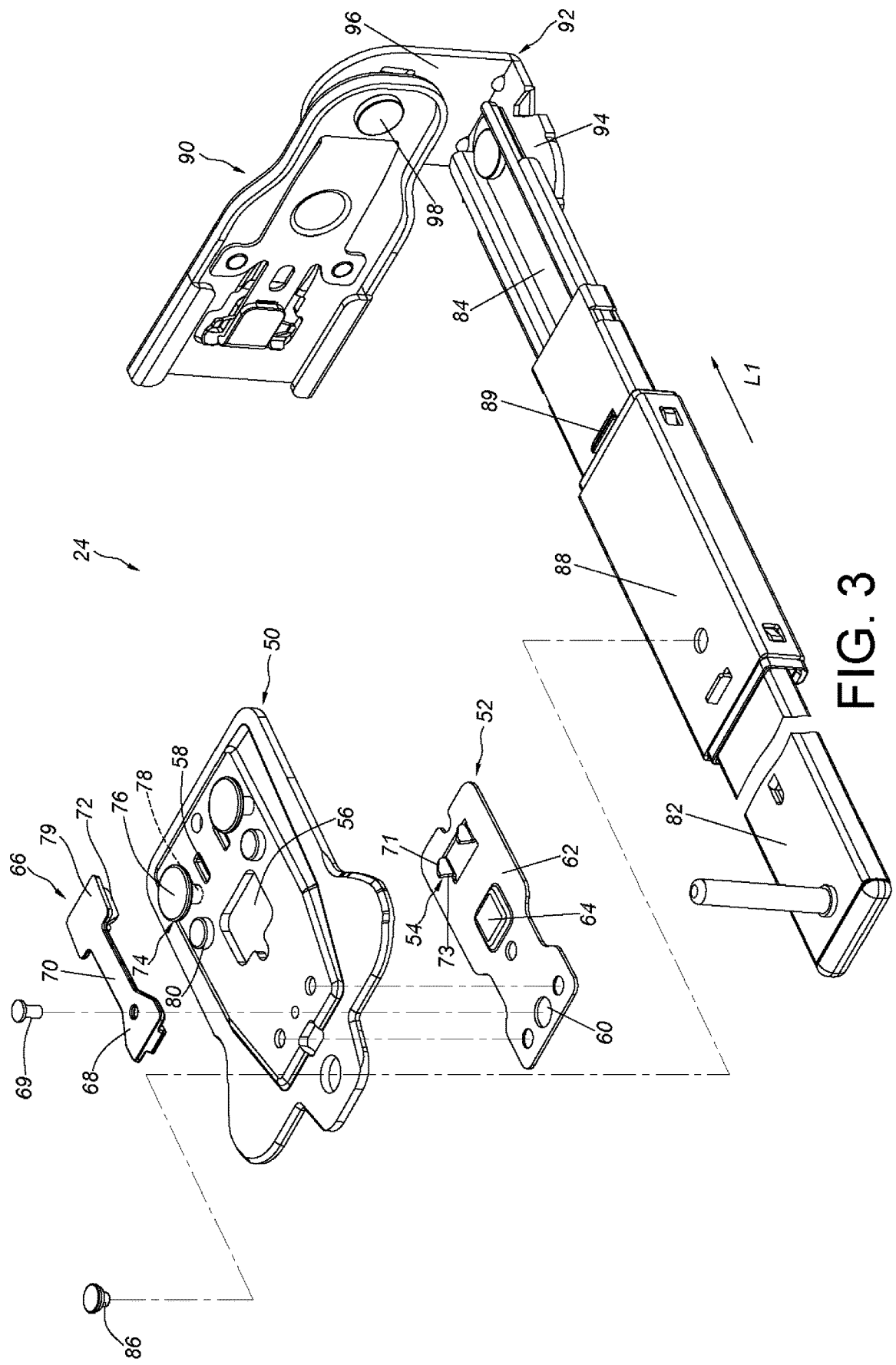
FIG. 3 is an explosion view illustrating a supporting device of the cable management assembly according to the embodiment of the present invention.
Figure 4:
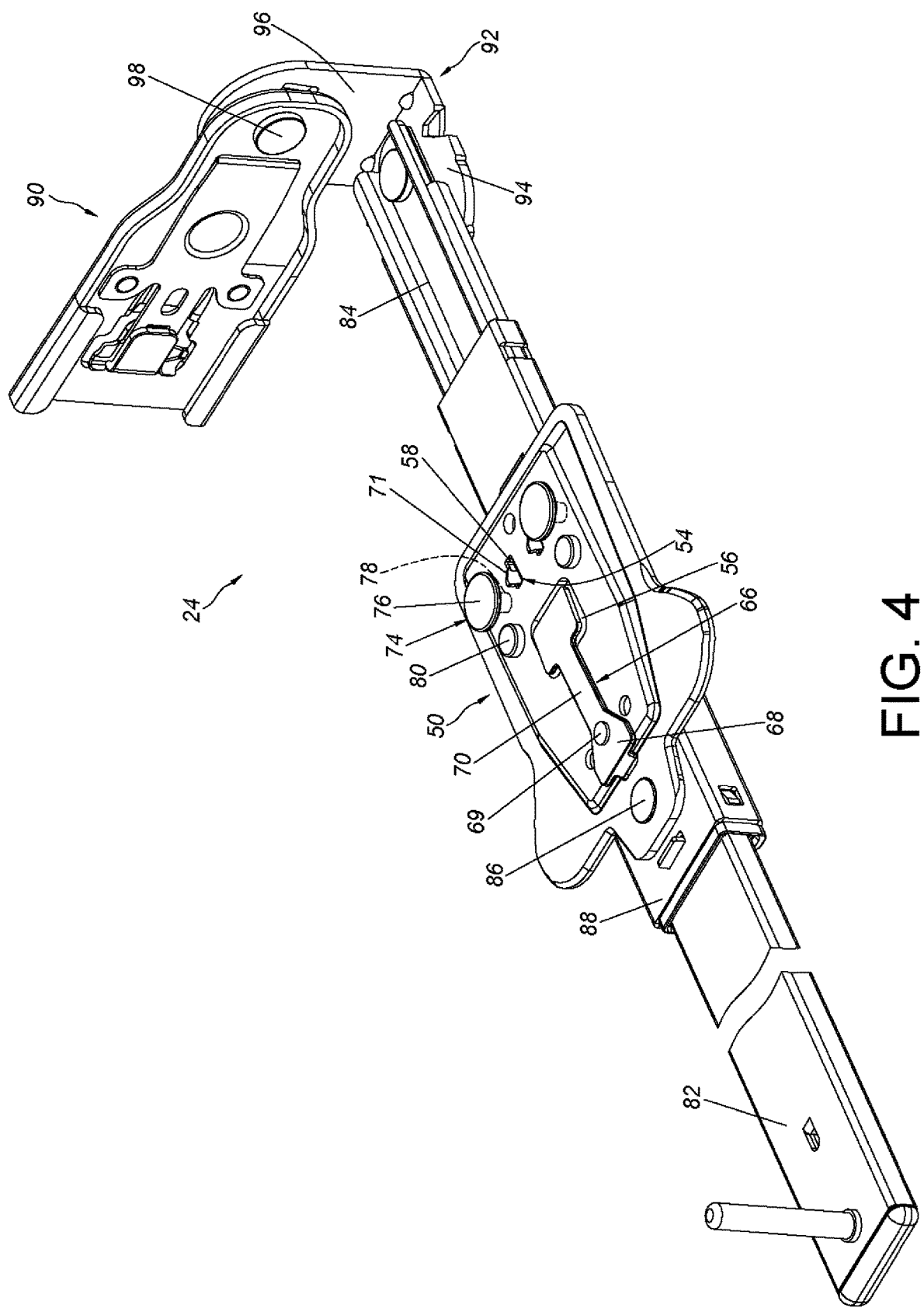
FIG. 4 is a diagram illustrating the supporting device of the cable management assembly according to the embodiment of the present invention.

As shown in FIG. 2, FIG. 3 and FIG. 4, the supporting device 24 is configured to support one of the first arm 26, the second arm 28 and the intermediate frame 30. The supporting device 24 includes a base 50 and an elastic member 52. Wherein the elastic member 52 is arranged on the base 50. The elastic member 52 has a second mounting feature 54, and the second mounting feature 54 is configured to be detachably mounted on the first mounting feature 36 of the intermediate frame 30.

Preferably, the base 50 has an upper side and a lower side, and the base 50 further has an opening 56 and a corresponding hole 58. The opening 56 and the corresponding hole 58 are both able to connect the upper side and the lower side. On the other hand, the elastic member 52 is arranged on the lower side of the base 50, and the elastic member 52 further has a connecting portion 60, an elastic arm 62 and an operating portion 64. The connecting portion 60 is connected (such as fixedly connected) to the base 50. The elastic arm 62 is connected to the connecting portion 60. The operating portion 64 and the second mounting feature 54 are both arranged on the elastic arm 62. Wherein, the position of the operating portion 64 corresponds to the position of the opening 56, and the position of the second mounting feature 54 corresponds the position of the corresponding hole 58. Preferably, the second mounting feature 54 penetrates through the corresponding hole 58 to the upper side of the base 50.

Preferably, the operating portion 64 is a convex, and the second mounting feature 54 is an engaging hook. In the present embodiment, two second mounting features 54 are arranged.

Preferably, the supporting device 24 further includes an operating member 66 arranged on the upper side of the base 50. The operating member 66 has a connecting section 68, an elastic section 70 and a driving section 72. The connecting section 68 is connected (such as fixedly connected by a fixing member 69) to the base 50, and the elastic section 70 is connected to the connecting section 68. The driving section 72 is arranged on the elastic section 70. Wherein, the position of the driving section 72 corresponds to the position of the opening 56. When a user presses a predetermined portion of the elastic section 70 (such as presses a portion 79 corresponding to the driving section 72), the driving section 72 is configured to abut against the operating portion 64 of the elastic member 52, in order to drive the elastic arm 62 of the elastic member 52 to deflect by an angle, such that the second mounting feature 54 is detached from corresponding hole 58 of the base 50. In the present embodiment, the portion 79 and the connecting section 68 are respectively located on two opposite ends of the elastic section 70, and the portion 79 and the driving section 72 are respectively located on two opposite sides of the operating member 66 (such as an upper side and a lower side of the operating member 66).

Preferably, the second mounting feature 54 of the elastic member 52 includes a guiding section 71 and a standing section 73 adjacent to the guiding section 71. Wherein, the guiding section 71 is an inclined surface or an arc surface.

Preferably, the base 50 has a second connecting feature 74 is able to abut against the first connecting feature 38 of the intermediate frame 30.

Preferably, one of the first connecting feature 38 and the second connecting feature 74 is a notch. The other one of the first connecting feature 38 and the second connecting feature 74 includes a head portion 76 and a body portion 78. In the present embodiment, the first connecting feature 38 is a notch, and the second connecting feature 74 includes the head portion 76 and the body portion 78.

Preferably, one of the cable management device 22 and the supporting device 24 includes a blocking feature 80. In the present embodiment, the supporting device 24 includes the blocking feature 80, and the blocking feature 80 is a convex adjacent to the second connecting feature 74, but the present invention is not limited specifically.

Preferably, the supporting device 24 further includes at least one supporting rail. In the present embodiment, a first supporting rail 82 and a second supporting rail 84 are able to be extended and retracted relative to each other, but the present invention is not limited specifically. The base 50 is pivoted to the at least one supporting rail (such as the first supporting rail 82). For example, the base 50 is pivoted to a movable member 88 of the at least one supporting rail (such as the first supporting rail 82) through a shaft member 86. The movable member 88 is movable along a length direction L of the at least one supporting rail (such as the first supporting rail 82).

Preferably, the at least one supporting rail (such as the first supporting rail 82) has a limiting portion 89 configured to allow the movable member 88 to be moved along only one direction L1 to a position.

Preferably, a third connecting device 90 is pivoted to an end portion of the at least one supporting rail (such as the second supporting rail 84). Furthermore, the supporting device 24 further includes a mounting base 92. The mounting base 92 includes a first mounting portion 94 and a second mounting portion 96 substantially perpendicularly connected to the first mounting portion 94. The first mounting portion 94 is connected to the at least one supporting rail (such as the second supporting rail 84), and the third connecting device 90 is pivoted to the second mounting portion 96 through a connecting shaft 98. For example, the connecting shaft 98 penetrates the third connecting device 90 and the second mounting portion 96. In the present embodiment, the limiting portion 89 is configured to limit the movable member 88 from being moved along a retraction direction (also known as the direction L1) toward the mounting base 92, such that the movable member 88 may be blocked at a blocking position by the limiting portion 89.

Figure 5:
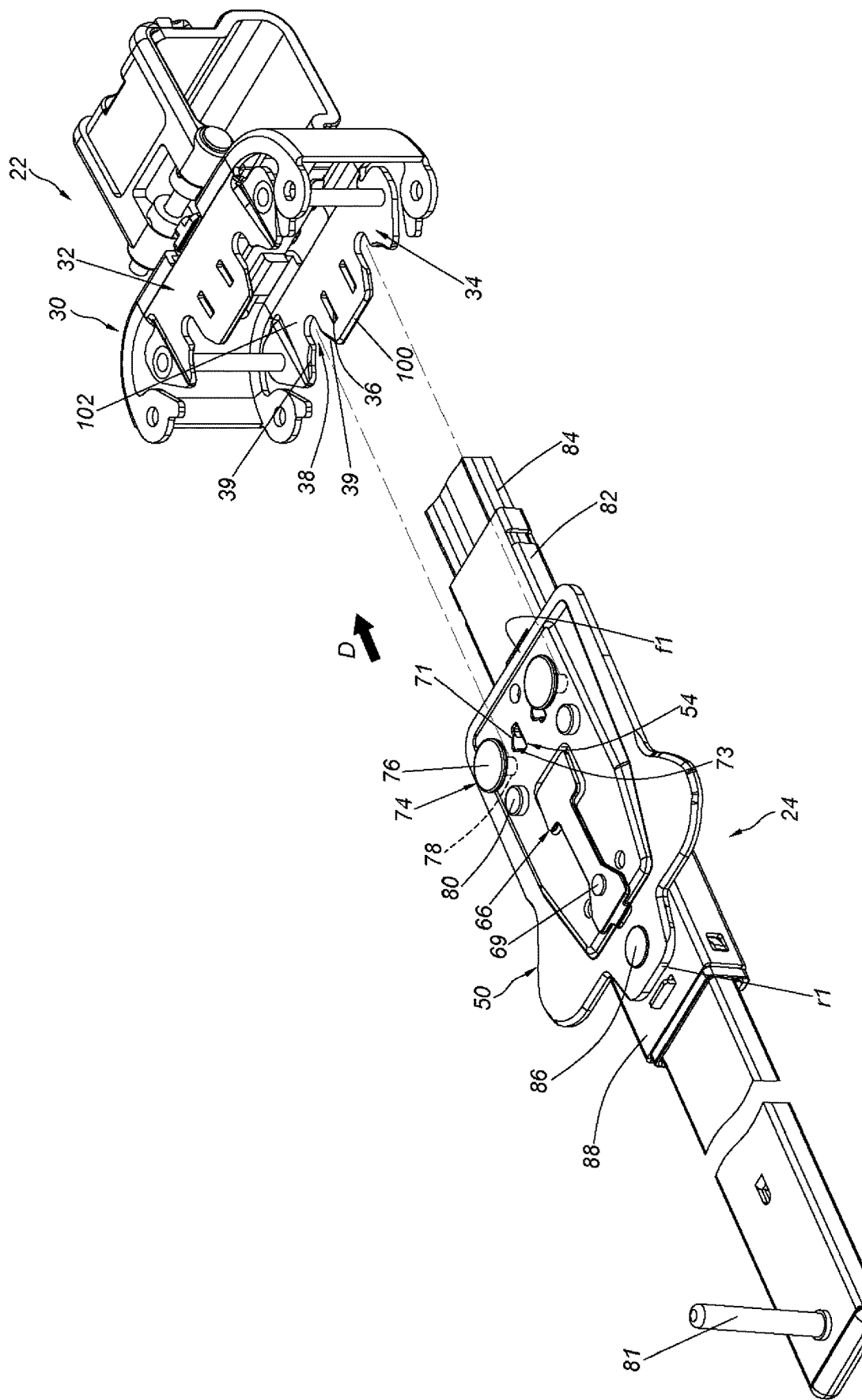
FIG. 5 is an explosion view illustrating a cable management device and the supporting device of the cable management assembly according to the embodiment of the present invention.
Figure 6:
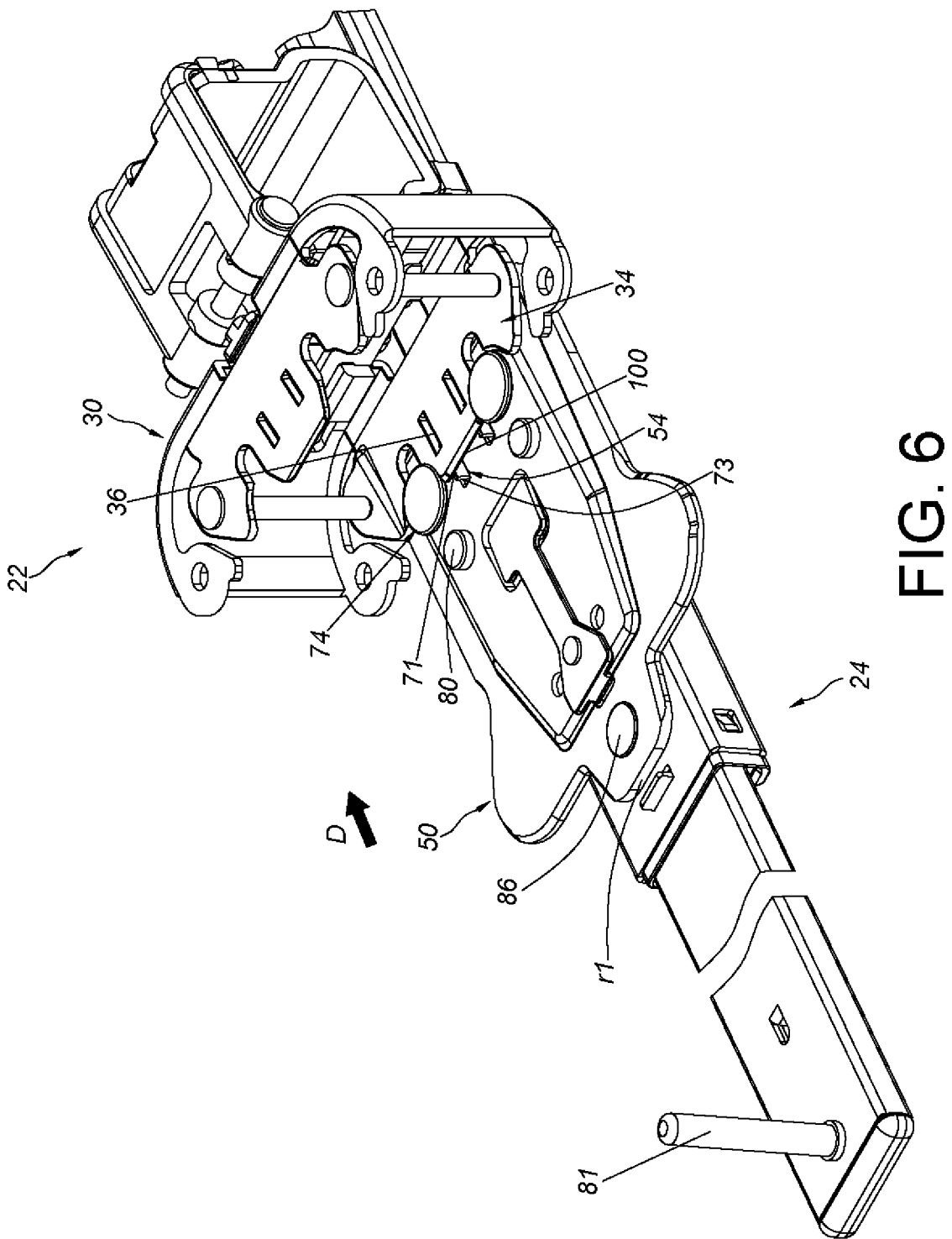
FIG. 6 is a diagram illustrating the mounting procedure of the cable management device and the supporting device of the cable management assembly according to the embodiment of the present invention.
Figure 7:
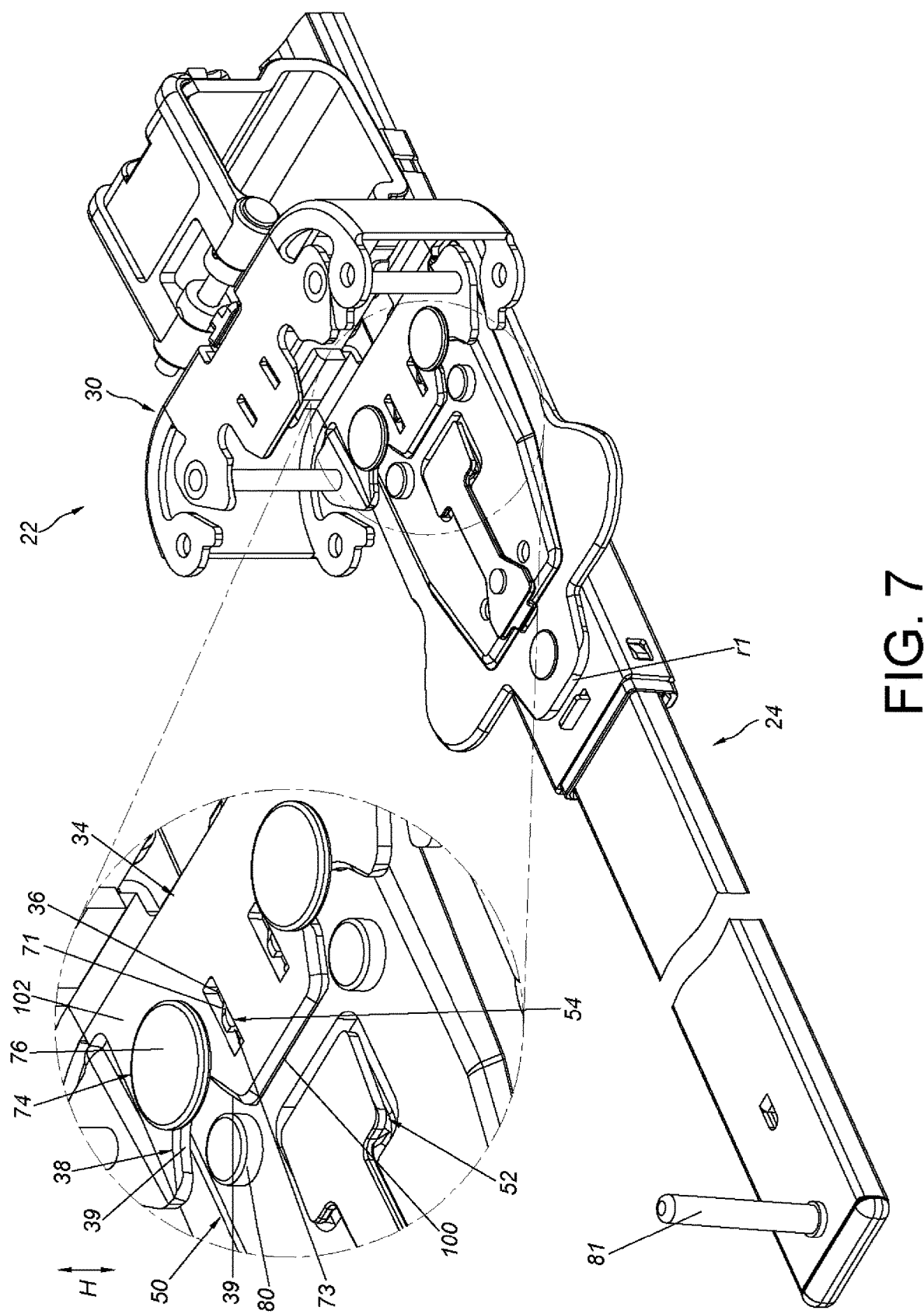
FIG. 7 is a diagram illustrating the cable management device and the supporting device of the cable management assembly being mounted on each other according to the embodiment of the present invention.

As shown in FIG. 5, FIG. 6 and FIG. 7, when one of the supporting device 24 and the cable management device 22 (in FIG. 5, FIG. 6 and FIG. 7, only the intermediate frame 30 of the cable management device 22 is shown to represent the cable management device 22) is moved along a mounting direction D relative to the other one of the supporting device 24 and the cable management device 22, the guiding section 71 of a front end f1 of the base 50 of the supporting device 24 is able to guide the second mounting feature 54 of the supporting device 24 and the first mounting feature 36 of the cable management device 22 to be mounted on each other. In the present embodiment, the supporting device 24 is moved along the mounting direction D to be mounted on the cable management device 22, but the present invention is not limited specifically.

For example, when the supporting device 24 is moved relative to the cable management device 22 along the mounting direction D (as shown in FIG. 5), the guiding section 71 of the second mounting feature 54 of the elastic member 52 is able to abut against one of the upper frame 32 of the intermediate frame 30 of the cable management device 22 and the lower frame 34 (such as the guiding section 71 of the second mounting feature 54 of the elastic member 52 abuts against a lower portion 100 of the lower frame 34, as shown in FIG. 6) to apply a force on the elastic arm 62 of the elastic member 52, such that the elastic arm 62 is elastically deflected to accumulate an elastic force. When the position of the second mounting feature 54 corresponds to the first mounting feature 36 of the lower frame 34 of the intermediate frame 30 of the cable management device 22, the second mounting feature 54 penetrates again through the corresponding hole 58 to the upper side of the base 50 in response to the elastic force of the elastic arm 62, such that the second mounting feature 54 is able to be engaged with the first mounting feature 36 (as shown in FIG. 7) through the standing section 73. It is noticed that when a user mounts the intermediate frame 30 on the base 50, the user may hold the movable member 88 and the first supporting rail 82, such that the movable member 88 is prevented from being moved relative to the first supporting rail 82 along a direction opposite to the mounting direction D.

Alternatively, the first supporting rail 82 includes a standing pole 81 located on an end of the first supporting rail 82. The standing pole 81 may also be configured to prevent the movable member 88 from being moved relative to the first supporting rail 82 along the direction. According to the above arrangement, the second mounting feature 54 of the supporting device 24 and the first mounting feature 36 of the cable management device 22 are able to be mounted on each other. In the present embodiment, the guiding section 71 is an inclined surface, the angle between the inclined direction of the inclined surface and the mounting direction D is greater than 90 degrees. In other words, in a direction from a rear end r1 to the front end f1 of the base 50, the distance between the inclined surface (the guiding section 71) and an upper surface of the base 50 is reducing.

Preferably, when the second mounting feature 54 of the supporting device 24 and the first mounting feature 36 of the cable management device 22 have been mounted on each other, on the other hand, the second connecting feature 74 is connected to the first connecting feature 38, in order to prevent the cable management device 22 and the supporting device 24 from being detached from each other along a height direction H (as shown in FIG. 7). Wherein, the height direction H and the mounting direction D are substantially perpendicular. The height direction H and the upper surface of the base 50 are substantially perpendicular.

Preferably, when the first connecting feature 38 (such as a notch) is engaged with the body portion 78 of the second connecting feature 74, an edge wall 102 (as shown in FIG. 5 and FIG. 7) around the first connecting feature 38 (such as a notch) and the head portion 76 of the second connecting feature 74 are blocked by each other along the height direction H. As shown in FIG. 5 and FIG. 7, the first connecting feature 38 (such as a notch) has a guiding structure 39. The guiding structure 39 is configured to guide the body portion 78 of the second connecting feature 74 to get in the notch, such that the second connecting feature 74 is able to be engaged with the first connecting feature 38.

Figure 8:
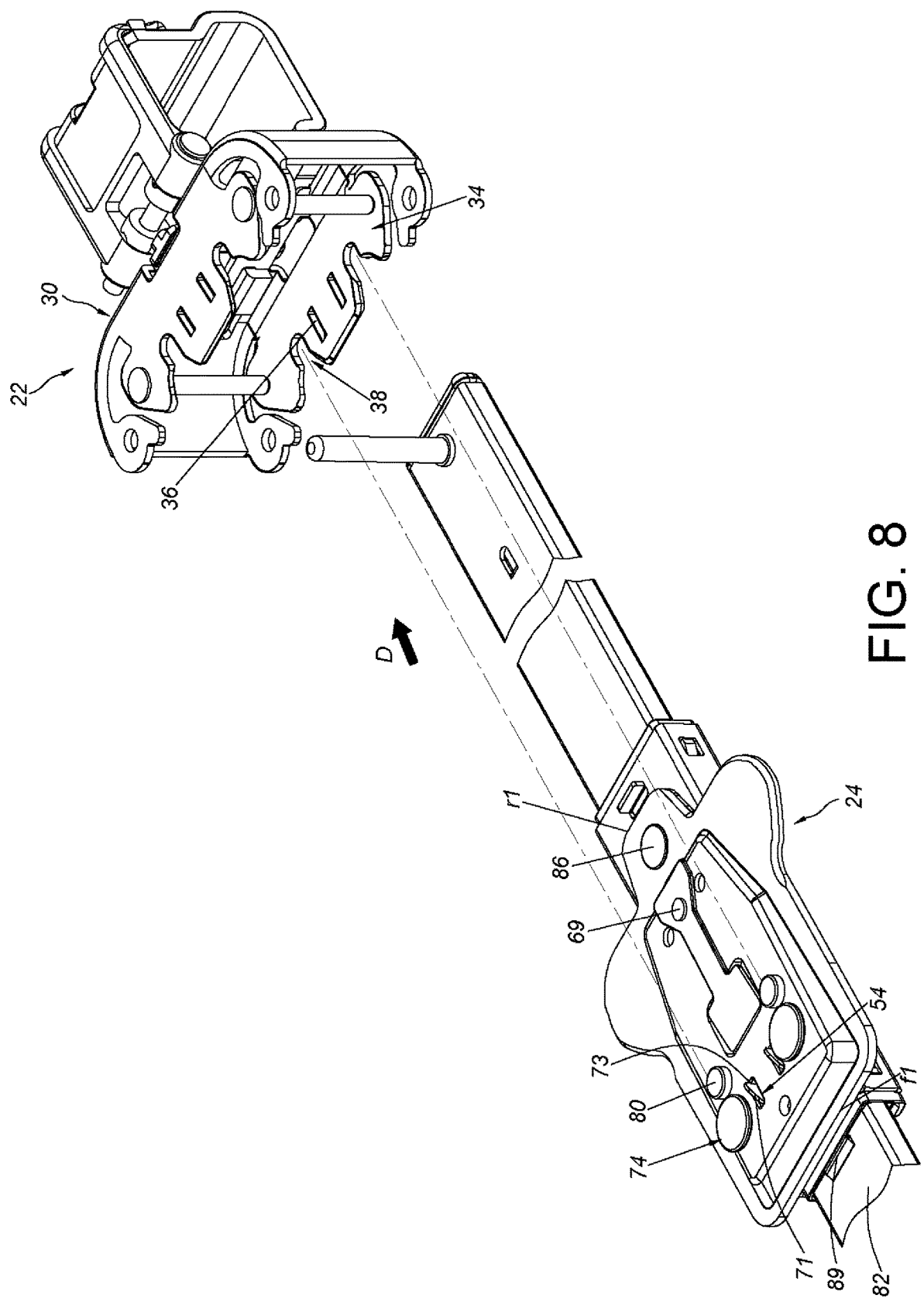
FIG. 8 is a diagram illustrating the cable management device and the supporting device of the cable management assembly being mounted along a wrong mounting direction according to the embodiment of the present invention.
Figure 9:
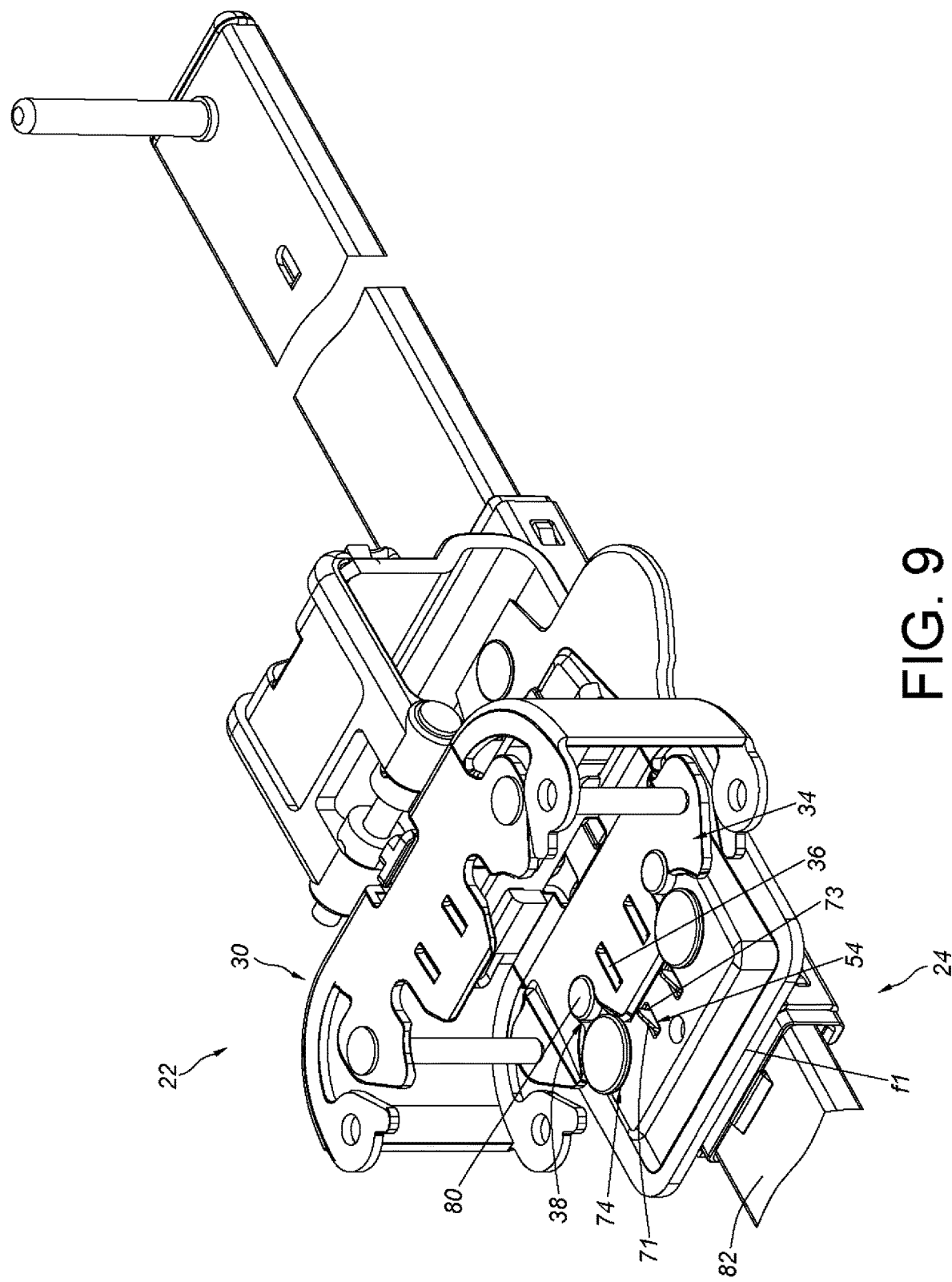
FIG. 9 is a diagram illustrating the supporting device and the cable management device of the cable management assembly being not able to be mounted through a blocking feature according to the embodiment of the present invention.

FIG. 8 and FIG. 9 are illustrating a wrong mounting status. When the supporting device 24 is moved relative to the cable management device 22 to use the rear end r1 of the base 50 to be mounted on the cable management device 22 along the mounting direction D, the embodiment of the present invention has a blocking feature 80, such that the supporting device 24 and the cable management device 22 are blocked by each other (as shown in FIG. 9), in order to prevent the second mounting feature 54 of the supporting device 24 and the first mounting feature 36 of the cable management device 22 are mounted on each other. According to the above arrangement, the embodiment of the present invention has an anti-reverse function and an error proof function. For example, when the supporting device 24 is moved relative to the cable management device 22 to be mounted on the cable management device 22 along the mounting direction D, the blocking feature 80 is able to get in the first mounting feature 36. After the blocking feature 80 gets in the first mounting feature 36, an edge of the first mounting feature 36 blocks the blocking feature 80 from being moved along the mounting direction D. As such, the corresponding structure between the blocking feature 80 and the first mounting feature 36 blocks is able to block the second mounting feature 54 of the supporting device 24 and the first mounting feature 36 of the cable management device 22 from being be mounted on each other, and the second connecting feature 74 is not able to be connected to the first connecting feature 38 (as shown in FIG. 9).

Figure 10:
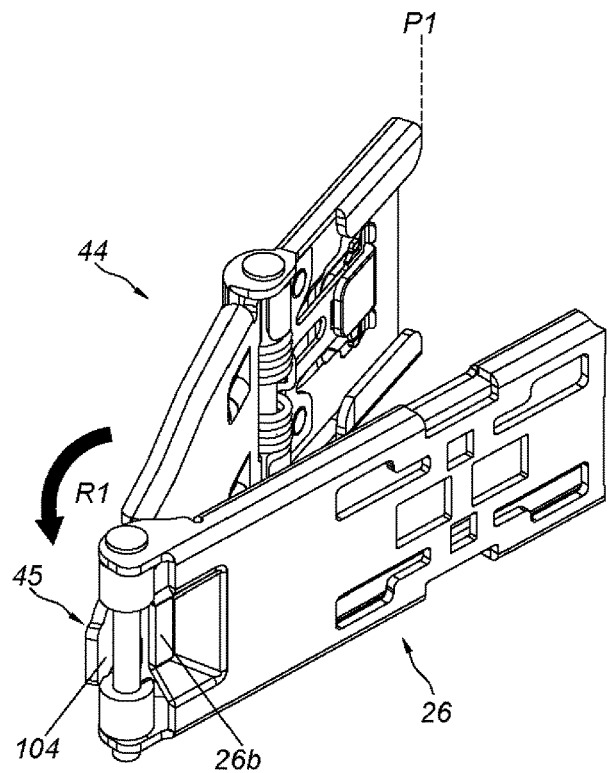
FIG. 10 is a diagram illustrating a connecting device of the cable management assembly being located at a first position relative to a cable management arm according to the embodiment of the present invention.
Figure 11:
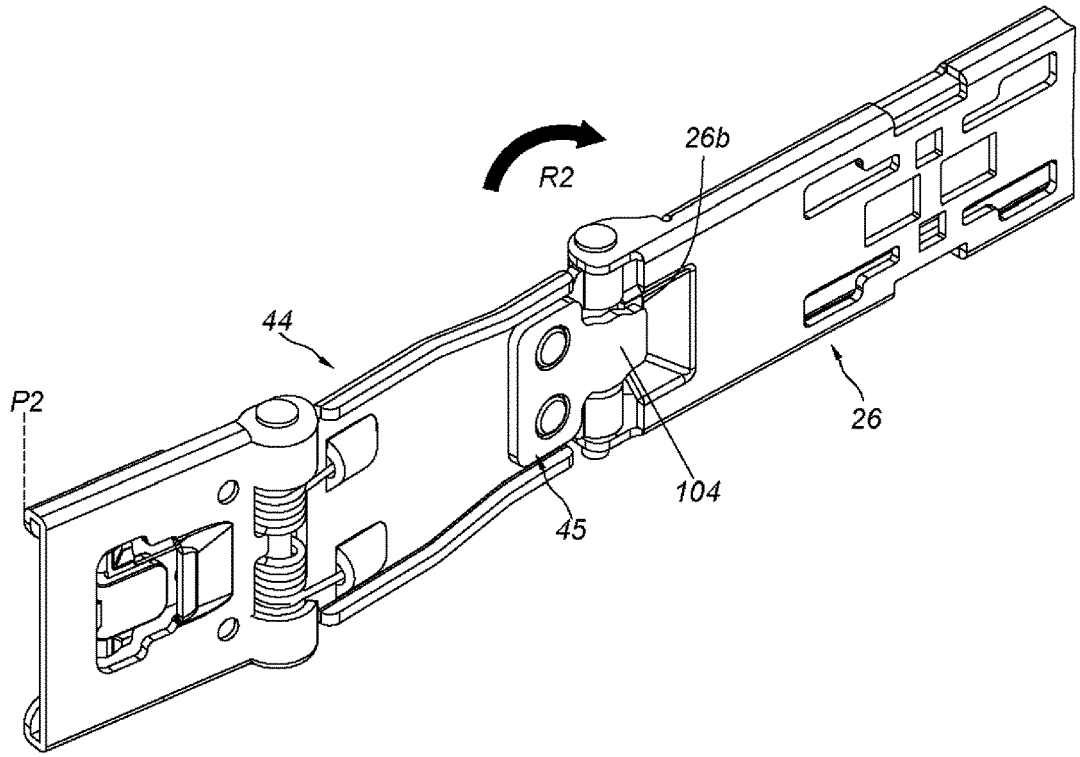
FIG. 11 is a diagram illustrating the connecting device of the cable management assembly being rotated to a second position relative to the cable management arm according to the embodiment of the present invention.

As shown in FIG. 10 and FIG. 11, the first blocking member 45 arranged between the second end portion 26b of the first arm 26 and the first connecting device 44 is able to be configured to restrict the first connecting device 44 to be rotated relative to the second end portion 26b of the first arm 26 in a predetermined angle range, such that the embodiment of the present invention has an angle limitation function. Preferably, the predetermined angle range is substantially 180 degree. Furthermore, the first connecting device 44 is able to be rotated relative to the second end portion 26b of the first arm 26 from a first position P1 (as shown in FIG. 10) along a first rotation direction R1 to a second position P2 (as shown in FIG. 11). Alternatively, the first connecting device 44 is able to be rotated from the second position P2 along a second rotation direction R2 opposite to the first rotation direction R1 to the first position P1. Wherein, when the first connecting device 44 is located at the second position P2 (as shown in FIG. 11), the first connecting device 44 and the second end portion 26b of the first arm 26 are blocked by each other through a blocking portion 104 of the first blocking member 45, in order to prevent the first connecting device 44 from being further rotated from the second position P2 relative to the first arm 26 along the first rotation direction R1. It is noticed that the second blocking member 47 arranged between the second end portion 28b of the second arm 28 and the second connecting device 46 is also configured to restrict the second connecting device 46 relative to the second end portion 28b of the second arm 28 to be rotated in the predetermined angle range.

Figure 12:
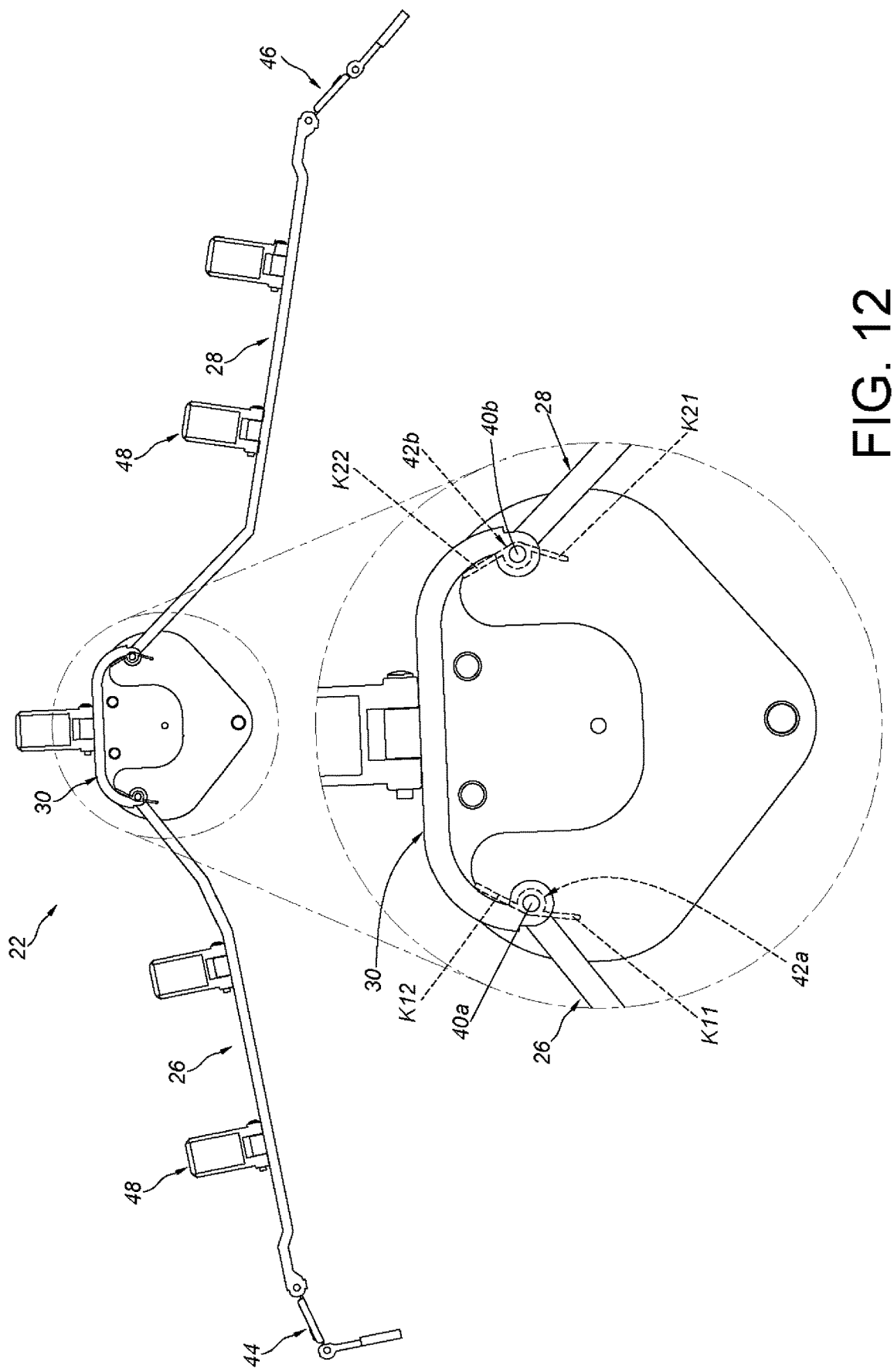
FIG. 12 is a diagram illustrating two cable management arms of the cable management assembly being in an open state relative to each other according to the embodiment of the present invention.
Figure 13:
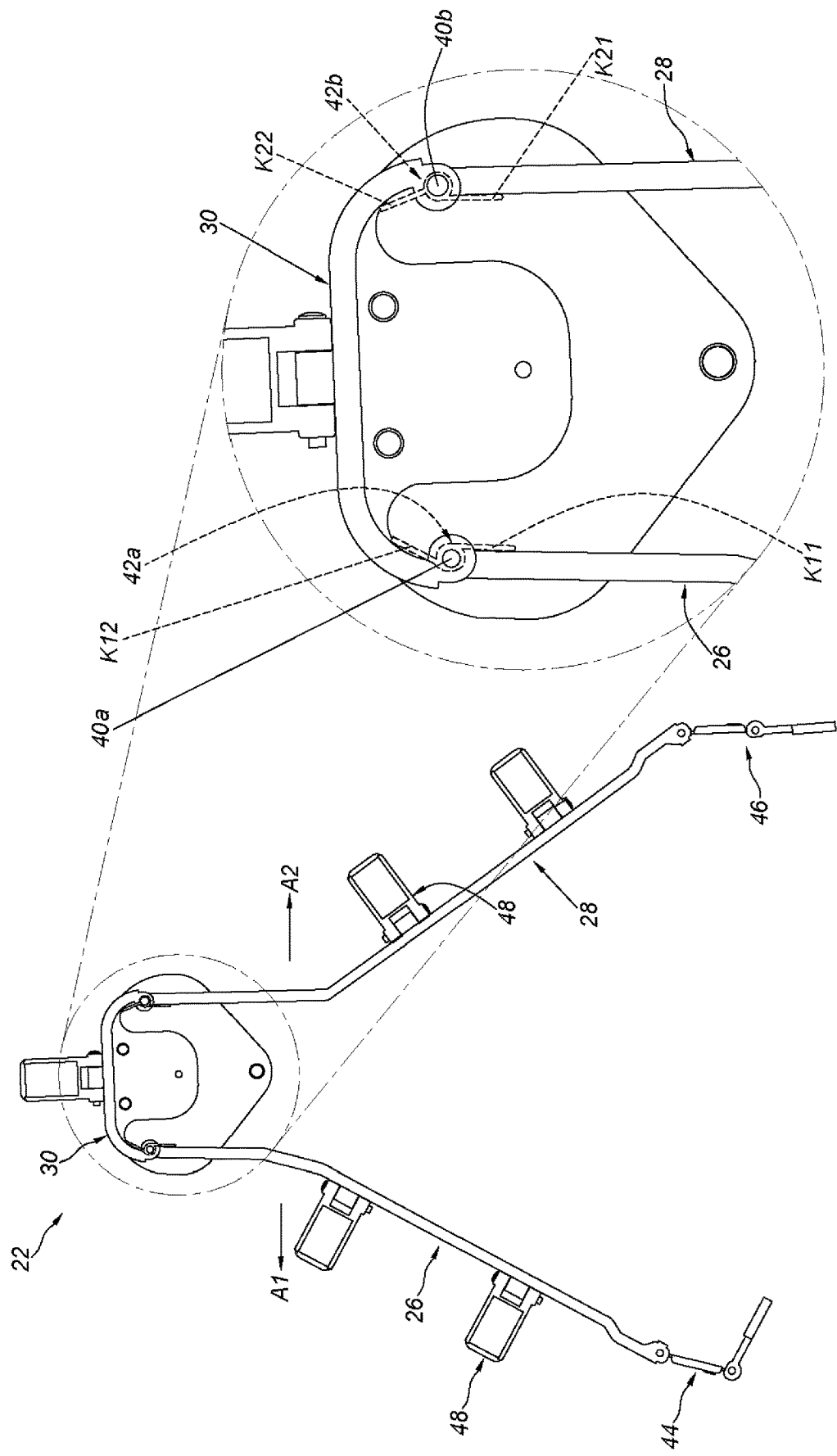
FIG. 13 is a diagram illustrating the two cable management arms of the cable management assembly being in a close state relative to each other according to the embodiment of the present invention.

As shown in FIG. 12 and FIG. 13, the first arm 26 of the cable management device 22 and the second arm 28 are able to be rotated relative to each other to be unfolded (as shown in FIG. 12) or to be folded (as shown in FIG. 13). Wherein, the protection device includes the first auxiliary elastic member 42a mounted between the first arm 26 and the intermediate frame 30, and the second auxiliary elastic member 42b is mounted between the second arm 28 and the intermediate frame 30. When the first arm 26 and the second arm 28 are rotated relative to each other to be folded (as shown in FIG. 13), the first elastic portion K11 and the second elastic portion K12 of the first auxiliary elastic member 42a are able to respectively support the first arm 26 and the intermediate frame 30, and the first elastic portion K21 and the second elastic portion K22 of the second auxiliary elastic member 42b are able to respectively support the second arm 28 and the intermediate frame 30. The above arrangement is able to prevent the first arm 26 and the second arm 28 from being folded too close (when being rotated relative to each other). In other words, a direction A1 and a direction A2 of the elastic force provided by the first auxiliary elastic member 42a and the second auxiliary elastic member 42b are able to promote the first arm 26 and the second arm 28 to be open, not close. Therefore, when a user holds the cable management assembly, the user's hand can be prevented from being pinched by the first arm 26 and the second arm 28 due to the two arms being automatic folded by the gravity and pivotal structure.

Compared to the prior art, the cable management assembly 20 of the present invention have advantages over the prior art by the following perspectives:

1. Through the blocking feature 80, the supporting device 24 and the cable management device 22 are blocked by each other (as shown in FIG. 9), in order to prevent the second mounting feature 54 of the supporting device 24 and the first mounting feature 36 of the cable management device 22 from being mounted on each other, such that the embodiment of the present invention has an anti-reverse function and an error proof function.

2. The first blocking member 45 arranged between the second end portion 26b of the first arm 26 and the first connecting device 44 is able to be configured to restrict the first connecting device 44 to be rotated relative to the second end portion 26b of the first arm 26 in a predetermined angle range.

3. The second blocking member 47 arranged between the second end portion 28b of the second arm 28 and the second connecting device 46 is able to be configured to restrict the second connecting device 46 to be rotated relative to the second end portion 28b of the second arm 28 in a predetermined angle range.

4. The first auxiliary elastic member 42a and the second auxiliary elastic member 42b are able to prevent the first arm 26 and the second arm 28 from being folded too close (when being rotated relative to each other), such that a user's hand is further prevented from being pinched by the first arm 26 and the second arm 28 due to the two arms being automatic folded by the gravity and pivotal structure.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A cable management assembly, comprising:
a cable management device comprising a first arm, a second arm and an intermediate frame pivoted between the first arm and the second arm, the intermediate frame comprising an upper frame and a lower frame, the upper frame and the lower frame respectively having a first mounting feature; and
a supporting device configured to support at least one of the first arm, the second arm and the intermediate frame, the supporting device comprising a base and an elastic member, wherein the elastic member is arranged on the base, the elastic member has a second mounting feature, and the second mounting feature is configured to be detachably mounted on the first mounting feature.

2. The cable management assembly of claim 1, wherein the second mounting feature of the elastic member comprises a guiding portion, when one of the supporting device and the cable management device is moved along a mounting direction relative to the other one of the supporting device and the cable management device, the second mounting feature of the supporting device and the first mounting feature of the cable management device can be guided to be mounted through the guiding portion.

3. The cable management assembly of claim 1, wherein one of the cable management device and the supporting device comprises a blocking feature, the base has a front end and a rear end opposite to the front end, the second mounting feature is located between the blocking feature and the front end of the base, the blocking feature is located between the second mounting feature and the rear end of the base, when one of the supporting device and the cable management device is mounted to the other one of the supporting device and the cable management device by orienting the rear end of the base as a mounting interface along a mounting direction, the supporting device and the cable management device are blocked by each other through the blocking feature, in order to prevent the second mounting feature of the supporting device and the first mounting feature of the cable management device from being mounted.

4. The cable management assembly of claim 2, wherein the upper frame and the lower frame further respectively comprises a first connecting feature, and the base comprises a second connecting feature configured to be detachably mounted on the first connecting feature, the second connecting feature is connected to the first connecting feature in order to prevent the cable management device from being detached from the supporting device along a height direction.

5. The cable management assembly of claim 4, wherein the height direction and the mounting direction are substantially perpendicular.

6. The cable management assembly of claim 4, wherein one of the first connecting feature and the second connecting feature is a notch, and the other one of the first connecting feature and the second connecting feature comprises a head portion and a body portion, when the notch is engaged with the body portion, an edge wall around the notch and the height direction are blocked by each other.

7. The cable management assembly of claim 1, wherein the supporting device further comprises at least one supporting rail, and the base is pivoted to the at least one supporting rail, the first arm and the second arm respectively have a first end portion, and the first end portion of the first arm and the first end portion of the second arm are pivoted to the intermediate frame by a first pivoting member and a second pivoting member respectively.

8. The cable management assembly of claim 7, wherein the cable management device further comprises a first auxiliary elastic member and a second auxiliary elastic member, the first auxiliary elastic member is configured to provide an elastic force to the first arm, and the second auxiliary elastic member is configured to provide an elastic force to the second arm.

9. The cable management assembly of claim 8, wherein the first auxiliary elastic member is mounted on the first pivoting member, the second auxiliary elastic member is mounted on the second pivoting member.

10. The cable management assembly of claim 7, wherein the first arm and the second arm respectively have a second end portion far from the first end portion, and the second end portion of the first arm and the second end portion of the second arm are respectively pivoted to a first connecting device and a second connecting device, the at least one supporting rail is pivoted to a third connecting device.

11. The cable management assembly of claim 10, wherein a first blocking member is arranged between the second end portion of the first arm and the first connecting device, the first blocking member is configured to restrict the first connecting device to be rotated relative to the second end portion of the first arm in a predetermined angle range.

12. The cable management assembly of claim 11, wherein a second blocking member is arranged between the second end portion of the second arm and the second connecting device, the second blocking member is configured to restrict the second connecting device to be rotated relative to the second end portion of the second arm in the predetermined angle range.

13. A cable management assembly, comprising:
a cable management device comprising a first arm, a second arm and an intermediate frame pivoted between the first arm and the second arm;
wherein the first arm and the second arm respectively have a first end portion, and the first end portion of the first arm and the first end portion of the second arm are pivoted to the intermediate frame by a first pivoting member and a second pivoting member respectively;
wherein the cable management device further comprises a first auxiliary elastic member and a second auxiliary elastic member, the first auxiliary elastic member is mounted between the first arm and the intermediate frame, and the second auxiliary elastic member is mounted between the second arm and the intermediate frame, the direction of the elastic force provided by the first auxiliary elastic member and the second auxiliary elastic member promote the first arm and the second arm to be open, not close.

14. The cable management assembly of claim 13, wherein the first auxiliary elastic member is mounted on the first pivoting member, and the second auxiliary elastic member is mounted on the second pivoting member, the first auxiliary elastic member has a first elastic portion and a second elastic portion, and the second auxiliary elastic member has a first elastic portion and a second elastic portion, the first elastic portion and the second elastic portion of the first auxiliary elastic member are respectively configured to support the first arm and the intermediate frame, the first elastic portion and the second elastic portion of the second auxiliary elastic member are respectively configured to support the second arm and the intermediate frame.

15. The cable management assembly of claim 13, wherein the first arm and the second arm respectively have a second end portion far from the first end portion, and the second end portion of the first arm and the second end portion of the second arm are respectively pivoted to a first connecting device and a second connecting device.

16. The cable management assembly of claim 13, wherein the intermediate frame comprises a frame, the frame has a first mounting feature, the cable management assembly further comprises a supporting device configure to support one of the first arm, the second arm and the intermediate frame, the supporting device comprises a base and an elastic member, wherein the elastic member is arranged on the base, the elastic member has a second mounting feature, and the second mounting feature is configured to be detachably mounted on the first mounting feature.

17. The cable management assembly of claim 16, wherein the second mounting feature of the elastic member comprises a guiding portion, when one of the supporting device and the cable management device is moved along a mounting direction relative to the other one of the supporting device and the cable management device, the second mounting feature of the supporting device and the first mounting feature of the cable management device can be guided to be mounted through the guiding portion.

18. The cable management assembly of claim 17, wherein one of the cable management device and the supporting device comprises a blocking feature, when one of the supporting device and the cable management device is moved along the mounting direction from a rear end of the base relative to the other one of the supporting device and the cable management device, the supporting device and the cable management device are blocked by each other through the blocking feature, in order to prevent the second mounting feature of the supporting device and the first mounting feature of the cable management device from being mounted.

19. The cable management assembly of claim 17, wherein the frame further comprises a first connecting feature, and the base comprises a second connecting feature configured to be detachably mounted on the first connecting feature, the second connecting feature is connected to the first connecting feature in order to prevent the cable management device from being detached from the supporting device along a height direction.

20. The cable management assembly of claim 19, wherein the height direction and the mounting direction are substantially perpendicular.

\* \* \* \* \*